(12) United States Patent
Senzaki et al.

(10) Patent No.: US 6,899,786 B2
(45) Date of Patent: May 31, 2005

(54) PROCESSING DEVICE AND METHOD OF MAINTAINING THE DEVICE, MECHANISM AND METHOD FOR ASSEMBLING PROCESSING DEVICE PART, AND LOCK MECHANISM AND METHOD FOR LOCKING THE LOCK MECHANISM

(75) Inventors: Shigeru Senzaki, Miyagi (JP); Toshiki Sasaki, Miyagi (JP); Tadashi Aoto, Miyagi (JP); Nobuyuki Nagayama, Yamanashi (JP); Kouji Mitsuhashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 177 days.

(21) Appl. No.: 10/276,671

(22) PCT Filed: May 16, 2001

(86) PCT No.: PCT/JP01/04066

§ 371 (c)(1),
(2), (4) Date: Nov. 18, 2002

(87) PCT Pub. No.: WO01/88971

PCT Pub. Date: Nov. 22, 2001

(65) Prior Publication Data

US 2004/0108068 A1 Jun. 10, 2004

(30) Foreign Application Priority Data

May 17, 2000 (JP) .................................... 2000-144966

(51) Int. Cl.[7] ..................... H01L 21/3065; H05H 1/00; C23C 16/00

(52) U.S. Cl. .................... 156/345.43; 156/345.33; 156/345.34; 156/345.47; 118/715; 118/723 E; 118/733

(58) Field of Search .............................. 118/715, 723 E, 118/733; 156/345.29, 345.33, 345.34, 345.43, 345.47

(56) References Cited

U.S. PATENT DOCUMENTS

| | | | | |
|---|---|---|---|---|
| 5,366,585 A | * | 11/1994 | Robertson et al. | ............ 216/67 |
| 5,558,717 A | * | 9/1996 | Zhao et al. | ................. 118/715 |
| 5,882,416 A | * | 3/1999 | Van Buskirk et al. | ...... 118/726 |

(Continued)

FOREIGN PATENT DOCUMENTS

| | | | |
|---|---|---|---|
| EP | 747932 A | * | 12/1996 |
| JP | 61-164507 A | * | 7/1986 |
| JP | 63-164507 A | * | 7/1988 |
| JP | 09-38481 A | * | 2/1997 |
| JP | 09-246187 A | * | 9/1997 |
| JP | 3131432 | | 11/2000 |
| JP | 3167799 | | 3/2001 |

OTHER PUBLICATIONS

PCT International Preliminary Examination Report, dated Feb. 27, 2003.

*Primary Examiner*—Jeffrie R. Lund
(74) *Attorney, Agent, or Firm*—Finnegan, Henderson, Farabow, Garrett & Dunner, LLP

(57) ABSTRACT

A processing device in which maintenance can be easily carried out and a burden on a worker can be reduced, and a method of maintaining the device are provided. An upper electrode unit 106 structuring a ceiling portion of a processing chamber 102 of an etching device 100 is structured from a lower assembly 128 at a processing chamber 102 side including an upper electrode 130, and an upper assembly 126 at a power supply side including an electro-body 144. A lock mechanism 156 is released, and after the upper assembly 126 is independently raised and removed by a lift mechanism 164, maintenance of the upper assembly 126 and/or the lower assembly 128 is carried out. The lock mechanism 156 is locked, and after the upper and lower assemblies 126, 128 are integrally raised and removed by the lift mechanism 164, maintenance of an interior of the processing chamber 102 is carried out.

4 Claims, 12 Drawing Sheets

U.S. PATENT DOCUMENTS

| | | | | |
|---|---|---|---|---|
| 5,959,409 A | * | 9/1999 | Dornfest et al. | 315/111.21 |
| 6,035,804 A | * | 3/2000 | Arami et al. | 118/723 E |
| 6,444,037 B1 | * | 9/2002 | Frankel et al. | 118/715 |
| 6,794,291 B2 | * | 9/2004 | Peace et al. | 438/694 |
| 2002/0139479 A1 | * | 10/2002 | Antolik | 156/345.47 |
| 2004/0108068 A1 | * | 6/2004 | Senzaki et al. | 156/345.43 |

\* cited by examiner (a)

(b)

| NO. | Processing conditions | HF processing time (minutes) | Number of particles (0.2μm↑)(number) | Particle component |
|-----|----------------------|------------------------------|--------------------------------------|--------------------|
| 1 | Only MC | 0 | 32 | Other than Si,O |
| 2 | MC+OB | 0 | 66 | Si,O |
| 3 | MC+OB | 10 | 25 | Other than Si,O |
| 4 | MC+OB | 30 | 8 | — |
| 5 | MC+OB | 60 | 8 | — |
| 6 | MC+OB | 120 | 18 | — |

※MC·····machining  OB·····over-blasting processing (a)

(b)

(a)

(b)

PROCESSING DEVICE AND METHOD OF MAINTAINING THE DEVICE, MECHANISM AND METHOD FOR ASSEMBLING PROCESSING DEVICE PART, AND LOCK MECHANISM AND METHOD FOR LOCKING THE LOCK MECHANISM

TECHNICAL FIELD

The present invention relates to a processing device and a method of maintaining the device, a mechanism and a method for assembling processing device parts, and a lock mechanism and a method for locking the lock mechanism.

BACKGROUND TECHNOLOGY

In the process of manufacturing a semiconductor device, a plasma processing device has been broadly used. The plasma processing device has an upper electrode and a lower electrode which are disposed so as to face one another in a processing chamber. In such a plasma processing device, by making the processing gas in the processing chamber be plasma by applying high-frequency electric power to the upper electrode, plasma processing is carried out on an object to be processed on the lower electrode.

An upper electrode unit in which the upper electrode is disposed has a complex structure in which a shield box, which accommodates a feeding member such as a feeding bar or the like feeding electrode high-frequency electric power to the upper electrode, and a matching box in which a matching machine or the like is accommodated, and a processing gas supplying system, and the like, are integrally assembled. Therefore, the upper electrode unit has been a unit such that, on the whole, the weight thereof is heavy and the volume thereof also is large.

Accordingly, when maintenance such as cleaning of the upper electrode or the interior of the processing chamber is carried out, there is the need for a worker to carry out the maintenance after the upper electrode unit is disassembled into members having weights and sizes which can be dealt with. Further, after the maintenance is completed, there is the need to assemble the respective members into the upper electrode unit again.

In this way, conventionally, disassembling and assembling of the device had to be carried out each time maintenance was carried out. As a result, there was the problem that the operation efficiency of the device deteriorated. Further, at the time of assembly, arranging the positions of the respective members must be accurately carried out. Therefore, there were the problems that the work was complicated, and further, the working time increased. Moreover, generally, the shield box and the matching box are disposed at a height at which it is difficult for the worker to work. Therefore, the worker must carry out the work of mounting and removing of the respective members at a difficult position. As a result, there was the problem that a burden was imposed on the worker.

The upper electrode is mounted to a member such as a cooling plate supporting the upper electrode by a fastening means such as metallic screws or the like. Therefore, in order to prevent abnormal discharge, the mounting portion of the fastening means, such as the periphery of the upper electrode or the like, is covered with an insulating shielding ring. Conventionally, the shielding ring is mounted to the cooling plate by a fastening means. However, depending on the structure of the fastening means, if the coefficients of linear expansion of the shielding ring and the cooling plate are different, different warpings arise at the shielding ring and the cooling plate due to heat at the time of processing, and as a result, there have been cases in which a load is applied to the fastening means and the fastening means is damaged.

Further, conventionally, the shielding ring is provided so as to simply overlap on the processing chamber side surface of the upper electrode. Therefore, a step arises between the upper electrode and the shielding ring, and this has been a cause of disturbing the plasma. As a result, there is the problem that the uniformity of processing cannot be improved.

The present invention has been achieved in consideration of the above-described problems which the conventional art has, and an object of the present invention is to provide a processing device and a method of maintaining the device, a mechanism and a method for assembling processing device parts, and a lock mechanism and a method for locking the lock mechanism, which can solve the above-described problems and other problems and which are novel and improved.

DISCLOSURE OF THE INVENTION

To overcome the above-described problems, in accordance with a first aspect of the present invention, there is provided a processing device which has an upper electrode unit structuring a ceiling portion of a processing chamber and a lift mechanism which can raise and lower the upper electrode unit, wherein the upper electrode unit is structured from a lower assembly at a processing chamber side and an upper assembly at a power supply side, and the lower assembly and the upper assembly can be separated and united by only a lock mechanism provided at an outer peripheral surface of the upper electrode unit, and the lower assembly can be airtightly fixed to the ceiling portion of the processing chamber by differential pressure between an interior and an exterior of the processing chamber and weight of the upper electrode unit, without a mechanical mechanism.

In accordance with the present invention, the upper electrode unit is structured from two assemblies which are easy for a worker to operate. Accordingly, the heavy-weight upper electrode unit can be divided and removed. Moreover, the respective assemblies can be mounted and removed by a lift mechanism. As a result, the burden on the worker can be reduced. Further, in accordance with the present invention, mounting and removing of the lower assembly and the upper assembly can be easily carried out by only the opening and closing of a locking mechanism. Moreover, arranging of the positions of the lower assembly and the upper assembly can be carried out on the basis of the locking mechanism. Therefore, both of the respective assemblies can be reliably integrated and tightly fit to one another.

Further, in accordance with the present invention, the lower assembly is fixed to the processing chamber by the pressure difference of the interior and exterior of the processing chamber and the weight of the upper electrode unit. In accordance with such a structure, if the pressure difference of the interior and exterior of the processing chamber is made small, the lower assembly can be easily removed. Further, if the lower assembly is set on the processing chamber and the pressure in the processing chamber is reduced, the processing chamber can be sealed. Therefore, opening and sealing operations of the interior of the processing chamber can be easily and rapidly carried out. As a result, the work time for maintenance of the interior of the processing chamber can be shortened. Further, the lower assembly is fixed without a mechanical mechanism. Therefore, at the time of work, it is hard for particles to be generated, and contamination of the interior of the processing chamber can be suppressed.

Moreover, at the time of maintenance of the interior of the processing chamber, it is preferable that the upper assembly and the lower assembly are integrally raised in a state in which the lock mechanism is locked. In accordance with such a structure, the respective assemblies can be integrally removed from the processing chamber by the operation of the lift mechanism. Therefore, maintenance of the interior of the processing chamber can be easily carried out. Moreover, the burden on the worker can be reduced even more.

Moreover, when parts which must be exchanged or cleaned are included in the lower assembly, at the time of maintenance of the parts, it is preferable that only the upper assembly is raised in a state in which the lock mechanism is unlocked. In accordance with such a structure, the upper assembly can be removed with the lower assembly remaining on the processing chamber. Therefore, maintenance of the upper assembly and the lower assembly can be easily carried out.

Further, in accordance with a second aspect of the present invention, there is provided a method of maintaining the processing device which is structured as described above, wherein the method comprises the step of maintaining the interior of the processing chamber after the upper assembly and the lower assembly are integrally raised by the lift mechanism in a state in which the lock mechanism is locked.

Further, in accordance with a third aspect of the present invention, there is provided a method of maintaining the processing device which is structured as described above, wherein the method comprises the step of maintaining the upper assembly and/or the lower assembly after the upper assembly is raised by the lift mechanism in a state in which the lock mechanism is unlocked.

In accordance with the inventions according to the second and the third aspects, maintenances of the interior of the processing chamber, or of the upper assembly and/or the lower assembly, can be easily and rapidly carried out while reducing the burden on the worker.

Further, in accordance with a fourth aspect of the present invention, there is provided a mechanism for assembling processing device parts of a cylindrical electrode assembly and a ring-shaped member which can be fit together with a periphery of the cylindrical electrode assembly, wherein a plurality of projections are formed at either one of an outer peripheral surface of the cylindrical electrode assembly or an inner peripheral surface of the ring-shaped member, and a plurality of grooves corresponding to the projections are formed at the other thereof, and the groove is formed from a first groove extending in a fitting-together direction so as to guide the projection in the fitting-together direction in order to fit together the cylindrical electrode assembly and the ring-shaped member, and a second groove extending in a rotating direction so as to guide the projection in order to relatively rotate the cylindrical electrode assembly and the ring-shaped member which have been once fitted together, and further, the second groove inclines in the fitting direction as the second groove goes deeper.

In accordance with the present invention, the cylindrical electrode assembly and the ring-shaped member can be mounted and removed by a rotating operation without using a fastening means such as screws or the like. Therefore, reducing of the burden on a worker and shortening of the working time can be achieved. Further, the cylindrical electrode assembly and the ring-shaped member are fixed by fitting-together the projections and the grooves. Further, after fixing as well, the projections can move in the grooves. Therefore, even if the cylindrical electrode assembly and the ring-shaped member are formed from materials whose coefficients of linear expansion are respectively different and different warpings arise due to heat at the time of processing, the loads applied to the projections and the grooves can be mitigated. As a result, the range of selection of the materials used for the cylindrical electrode assembly and the ring-shaped member is broadened, and restrictions on the design of the device can be overcome.

Moreover, the processing chamber side surfaces of the cylindrical electrode assembly and the ring-shaped member are preferably structured so as to be flush with one another at the time when the projection reaches to the deepest place of the second groove. In accordance with such a structure, a step difference is not formed between the cylindrical electrode assembly and the ring-shaped member. Therefore, the plasma generated in the interior of the processing chamber is not disturbed, and uniform processing can be carried out on the object to be processed.

Moreover, a step portion into which the ring-shaped member is fitted is preferably formed at the cylindrical electrode assembly. In accordance with such a structure, the processing chamber side surfaces of the cylindrical electrode assembly and the ring-shaped member can be easily made flush with one another.

Moreover, when the cylindrical electrode assembly is formed from an assembly of an electrode plate and a cooling plate and the ring-shaped member is structured from a shielding ring, the projections or the grooves are preferably formed at the cooling plate or the shielding ring. In accordance with such a structure, maintenance work of the cylindrical electrode assembly and the ring-shaped member can be easily carried out.

Further, in accordance with a fifth aspect of the present invention, there is provided a method for assembling a mechanism for assembling the processing device parts which is structured as described above, wherein the method comprises the step of relatively rotating the ring-shaped member and the cylindrical electrode assembly such that projections are guided along the second grooves, after the ring-shaped member is fit together with the cylindrical electrode assembly such that the projections are guided along the first grooves. In accordance with such a structure, fitting-together of the cylindrical electrode assembly and the ring-shaped member can be easily and rapidly carried out.

Further, in accordance with a sixth aspect of the present invention, there is provided a lock mechanism fixing a fixing pin side member and a corresponding groove side member by operating a fixing pin, which is freely rotatable around a shaft, to withdraw after projecting into a corresponding groove, wherein the fixing pin side member comprises: a first member to which the fixing pin is mounted and which allows rotating operation of the fixing pin between a first position, at which the fixing pin projects in a perpendicular direction, and a second position, at which the fixing pin inclines in an oblique direction and withdraws; and a second member which can move relatively with respect to the first member, and in which a pass-through hole, which can make the fixing pin pass through, is formed; and a first projection which is a fulcrum at the time when the fixing pin moves from the second position to the first position by relatively moving the first member and the second member in a locking direction, and a second projection which is a fulcrum at the time when the fixing pin moves from the first position to the second position by relatively moving the first member and the second member in an unlocking direction, are formed at the pass-through hole.

In accordance with the present invention, the fixing pin side member and the corresponding groove side member can be easily mounted and removed by the relative movement of the first member and the second member. Therefore, the burden on the worker can be reduced and the working time can be shortened more than in a case of fixing by a fastening means. Further, because a fastening means is not used, generation of particles can be suppressed.

Moreover, when cylindrical or ring-shaped members disposed on concentric circles are adopted as the corresponding groove side member, the first member, and the second member, it is preferable that the direction of relative movement is the rotating direction. In accordance with such a structure, mounting and removal of the fixing pin side member and the corresponding groove side member can be easily carried out.

Further, in accordance with a seventh aspect of the present invention, there is provided a method of locking the lock mechanism which is structured as described above, the method comprises the step of disposing the fixing pin from the second position to the first position by relatively moving the first member and the second member in the locking direction, and fixing the fixing pin side member and the corresponding groove member. In accordance with such a structure, the fixing pin side member and the corresponding groove side member can be easily fixed.

Moreover, if a step including a step of relatively moving the first member and the second member in the unlocking direction and disposing them from the first position to the second position, and separating the fixing pin side member and the corresponding groove member is carried out, the fixing pin side member and the corresponding groove side member can be easily separated.

Further, in accordance with an eighth aspect of the present invention, there is provided a lock mechanism, fixing by relatively rotating a first member and a second member set on the first member, comprising: a male member which is provided at either one of the first member or the second member and at which a pin member, having a shaft portion and a head portion whose diameter is larger than that of the shaft portion, is provided; and a female member which is provided at the other of the first member or the second member, and which is formed from an insertion hole having a groove width into which the head portion can be inserted, and a lock groove which communicates with the insertion hole and which has a groove width smaller than the head portion and larger than the shaft portion and which is along a radius of rotation, wherein the female member is formed so as to be thin at a vicinity of the insertion hole, and is formed so as to become successively thicker as the female member moves away from the insertion hole along the lock groove. Note that the present invention can be applied, for example, at the time of assembling an upper electrode structured from a lower assembly (the first member) and an upper assembly (the second member) set on the lower assembly.

Moreover, in accordance with a ninth aspect of the present invention, there is provided a method of locking by the above-described lock mechanism. Namely, by inserting a pin member which is the male member into an insertion hole which is the female member, and relatively rotating the first member and the second member along the lock groove, the first member and the second member are locked well.

BRIEF DESCRIPTION OF THE DRAWINGS

FIG. 3($b$) is a schematic perspective view expressing a state at the time of removing the shielding ring from the state of (a).

FIG. 7($b$) is a schematic enlarged side view expressing an inner peripheral surface of the shielding ring of the etching device shown in FIG. 1.

FIG. 8($b$) is a schematic cross-sectional view in which the lock mechanism at the time of unlocking shown in FIG. 2 is cut at the plane along line A—A.

FIG. 11($b$) is a schematic enlarged cross-sectional view expressing the periphery of an upper electrode unit, and corresponds to (a).

FIG. 12($b$) is a schematic enlarged cross-sectional view showing the periphery of the upper electrode unit, and corresponds to (a).

FIG. 13($b$) is a side view corresponding to (a).

BEST MODES FOR IMPLEMENTING THE INVENTION

Hereinafter, a suitable embodiment applied to a processing device and a method of maintaining the device, a mechanism and a method for assembling processing device parts, and a lock mechanism and a method for locking the lock mechanism, a plasma etching device and a method of maintaining the device relating to the present invention will be described in detail with reference to the appended figures.

(1) Overall Structure of Etching Device

Figure 1:
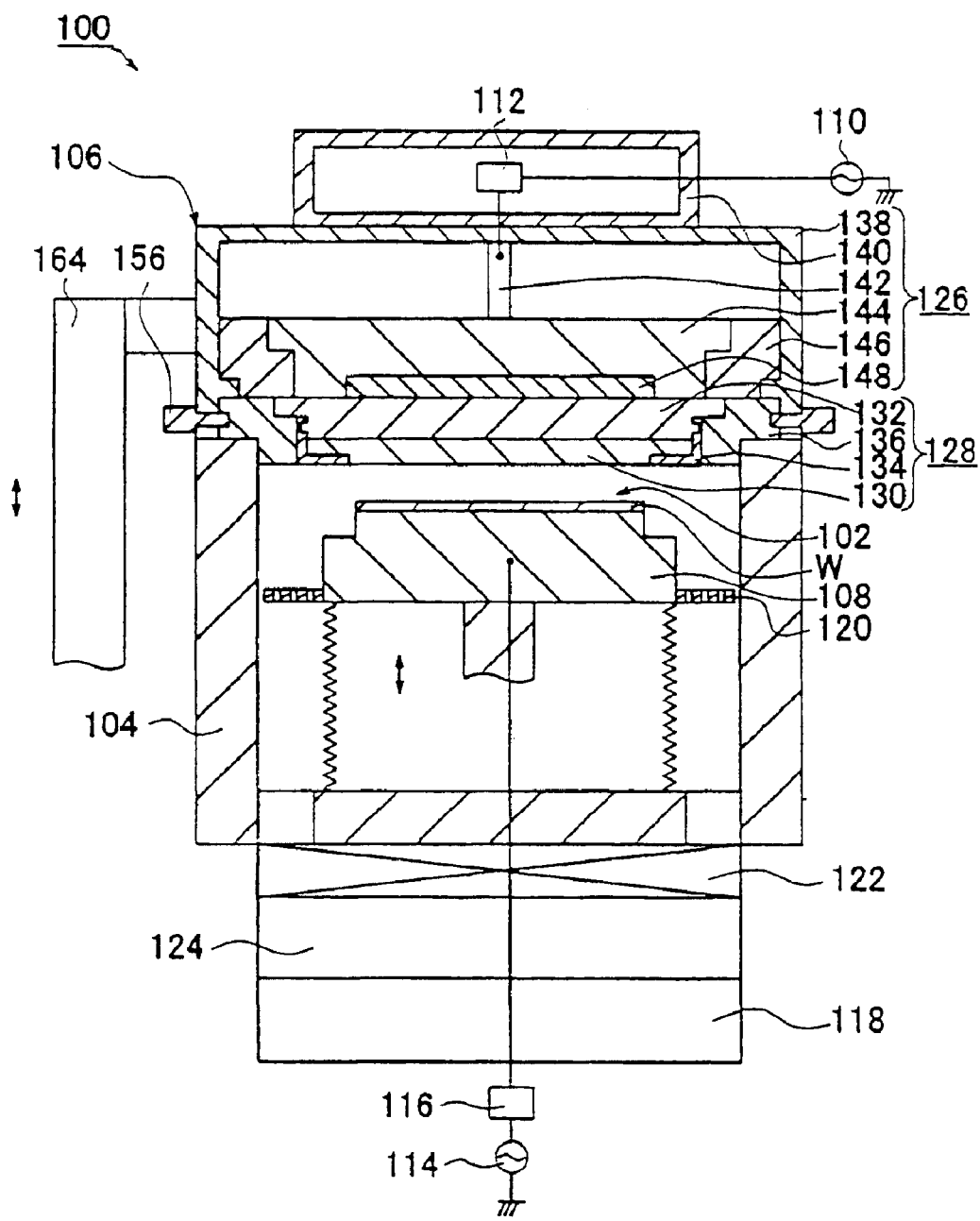
FIG. 1 is a schematic cross-sectional view showing an etching device capable of applying the present invention.

First, with reference to FIG. 1, the structure of an etching device 100 will be simply described. A processing chamber 102 has a conductive processing container 104 in the shape of A substantial cylinder whose top portion is open. The processing container 104 is safely-grounded via an unillustrated earthing wire. Further, an upper electrode unit 106 is airtightly mounted to a ceiling portion of the processing chamber 102. In the processing chamber 102, a conductive lower electrode 108 on which an object to be processed, for example, a semiconductor wafer (hereinafter, called "wafer") W can be placed is disposed.

The structure of the upper electrode unit 106 forms the central core of the present invention, and the detailed structure and operations thereof will be described later. Note that high-frequency electric power outputted from a high-frequency power source 110, for example, electric power of 13.56 MHz, is applied to the upper electrode unit 106 via a matching machine 112. Further, high-frequency electric power outputted from a high-frequency power source 114, for example, electric power of 380 kHz, is applied to the lower electrode 108 via a matching machine 116. By applying such electric power, the processing gas introduced into the processing chamber 102 is made to be plasma, and etching processing is carried out on the wafer W. Further, the gas in the processing chamber 102 is appropriately exhausted by a turbo-molecular pump 118 via an exhaust baffle plate 120, a opening/closing valve 122, and an exhaust amount adjusting valve 124 at the periphery of the lower electrode 108.

The etching device 100 to which the present invention can be applied is mainly structured as described above. Next, the structure of the upper electrode unit 106 forming the central core of the present invention will be described in detail.

(2) Structure of Upper Electrode Unit

Figure 2:
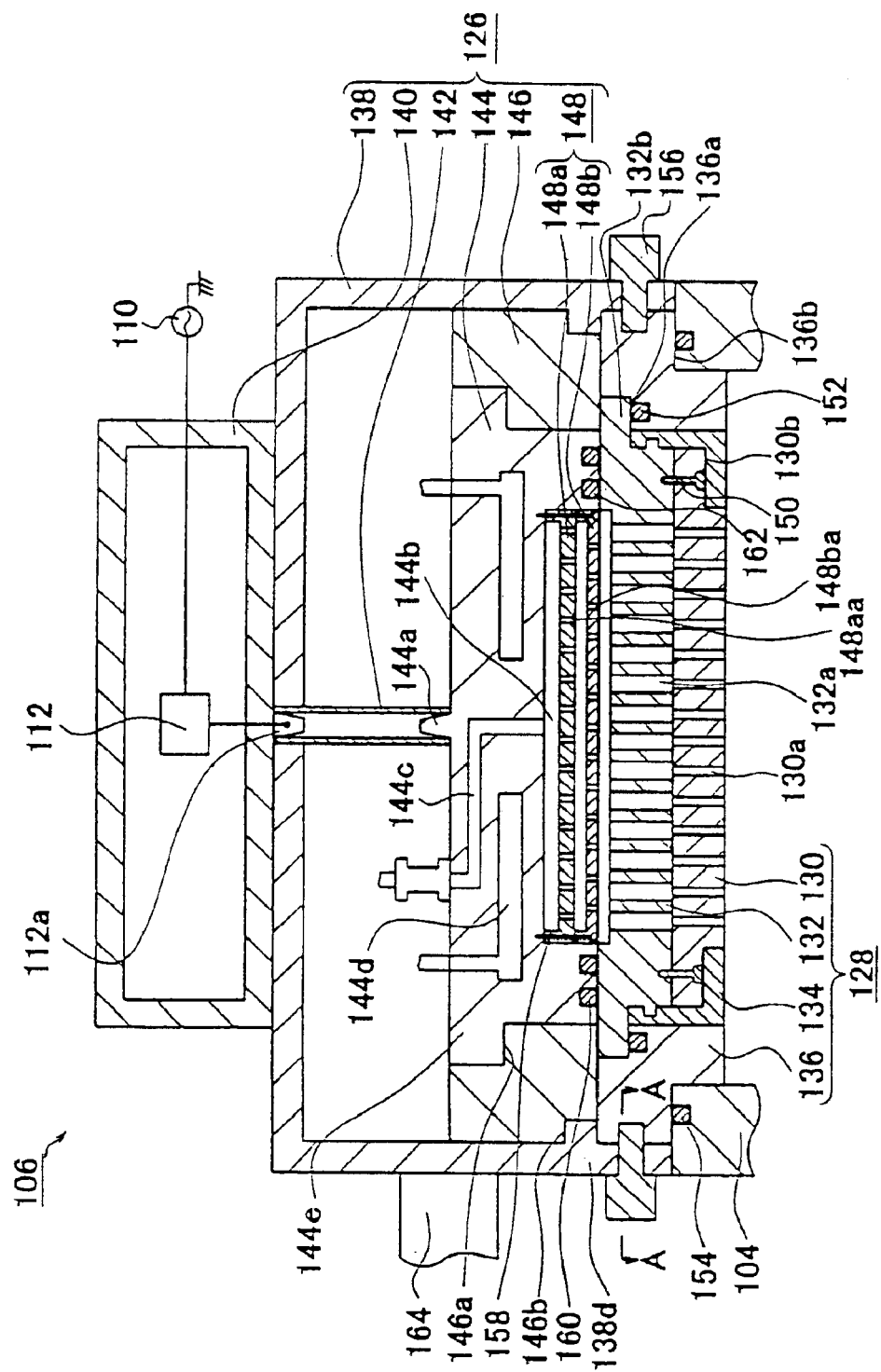
FIG. 2 is a schematic enlarged cross-sectional view showing an upper electrode unit of the etching device shown in FIG. 1.

The upper electrode unit 106 is mainly structured from an upper and lower assemblies 126, 128 as shown in FIG. 1 and FIG. 2. The lower assembly 128 is formed from an upper electrode (electrode plate) 130, a cooling plate 132, a shielding ring 134, and an insulator 136. The upper assembly 128 is formed from a shield box 138, a matching box 140, a feeding bar 142, an electro-body 144, an insulator 146, and a baffle plate 148. Hereinafter, structures of the respective assemblies will be described.

(a) Structure of Lower Assembly

Figure 3:
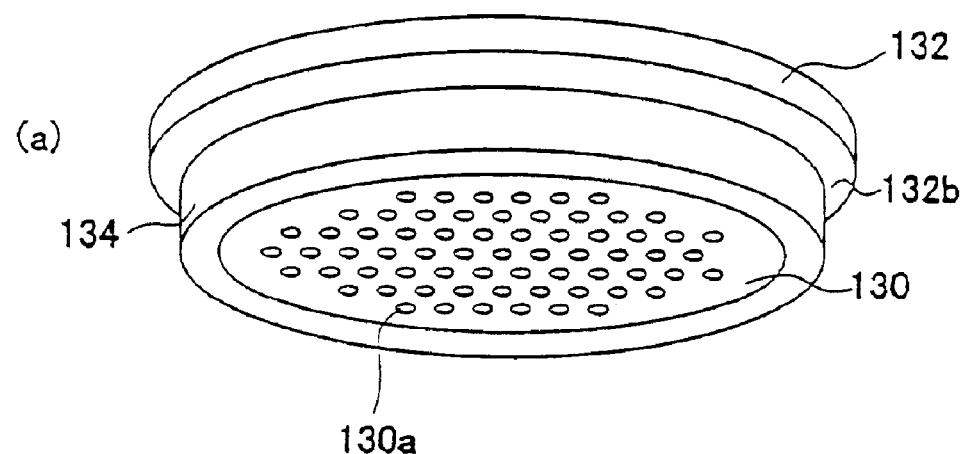
FIG. 3($a$) is a schematic perspective view expressing a state at the time of fitting together an upper electrode, a cooling plate, and a shielding ring of the etching device shown in FIG. 1.
Figure 3:
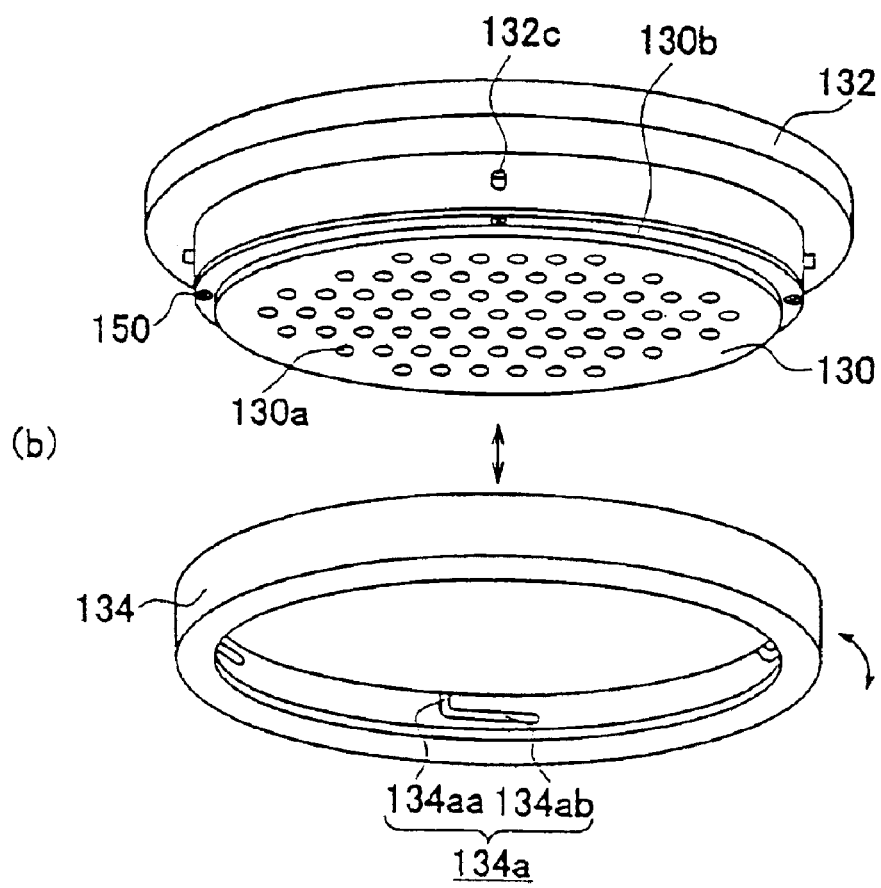
Figure 4:
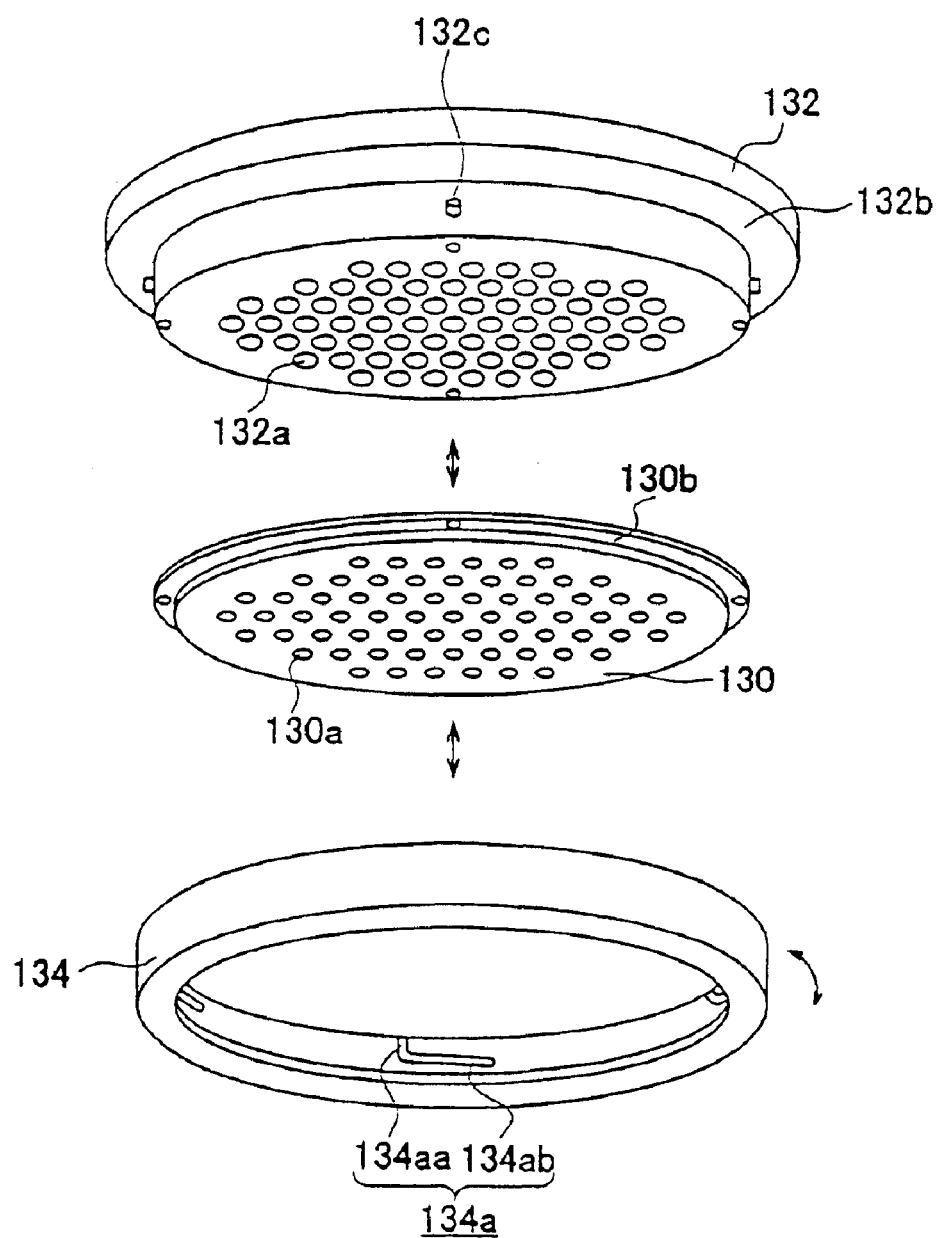
FIG. 4 is a schematic perspective view expressing a state at the time of removing the upper electrode from the state of FIG. 3($b$).

First, to describe the structure of the lower assembly 128, the upper electrode 130 is formed from, for example, SiC by a CVD manufacturing method or a hot press manufacturing method, or from aluminum which is anodized, and as shown in FIG. 3 and FIG. 4, the upper electrode 130 is formed in a substantial disc shape. Further, as shown in FIG. 2 through FIG. 4, a plurality of gas discharging holes 130a for discharging the processing gas are formed in the processing chamber 102.

Note that the CVD manufacturing method is a manufacturing method in which SiC is vapor-phase grown on the surface of a high purity carbon material by using an Si type gas under reduced pressure. Further, the hot press manufacturing method is a manufacturing method in which a binder such as boron or the like is added to an SiC powder by the CVD manufacturing method, and it is calcined under high temperature and high pressure. Further, a columnar crystal silicon has a crystal characteristic equivalent to monocrystalline silicon and workability and thermal conductivity equivalent to or better than monocrystalline silicon, and can be extremely simply and inexpensively manufactured.

Further, as shown in FIG. 2, FIG. 3(b), and FIG. 4, a step portion 130b, relating to the present embodiment and for making the processing chamber 102 side surfaces of the upper electrode 130 and the shielding ring 134 be flush at the time of fitting together the shielding ring 134 described later, is formed at the processing chamber 102 side outer rim portion of the upper electrode 130. In accordance with such a structure, as shown in FIG. 2 and FIG. 3(a), at the time of fitting together the shielding ring 134, no step difference arises between the upper electrode 130 and the shielding ring 134. As a result, the plasma generated in the processing chamber 102 is not disturbed, and uniform processing can be carried out.

Further, as shown in FIG. 2 and FIG. 3(b), the cooling plate 132, transmitting electric power to the upper electrode 130 and transmitting heat generated at the upper electrode 130 to the electro-body 144 structuring the upper assembly 126, is mounted by fastening members 150 such as screws or the like to the top portion of the upper electrode 130. Note that, because the fastening members 150 are covered by the shielding ring 134, the fastening members 150 are not exposed to the processing chamber 102.

The cooling plate 132 is formed from, for example, aluminum which is anodized, and is formed in a substantially cylindrical shape as shown in FIG. 3 and FIG. 4. Further, as shown in FIG. 2 and FIG. 4, gas supplying paths 132a, for transmitting the processing gas which passed through the baffle plate 148 structuring the upper assembly 126 to the gas discharging holes 130a of the upper electrode 130, are provided in the cooling plate 132.

Further, as shown in FIG. 2 through FIG. 4, an overhang portion 132b engaged with a step portions 136a formed at the insulator 136 is formed at the outer periphery of the cooling plate 132. The overhang portion 132b and the step portion 136a are formed such that the processing chamber 102 side surfaces of the upper electrode 130 or the shielding ring 134 and the insulator 136 are made to be flush at the time of fitting-together. Therefore, no step difference is formed between the insulator 136 and the shielding ring 134, and disturbing of the plasma can be further prevented.

Further, as shown in FIG. 2 through FIG. 4, the shielding ring 134, which covers the processing chamber 102 side outer rim portion of the upper electrode 130 and which is for preventing the above-described fastening members 150 from being exposed to the interior of the processing chamber 102, is mounted to the cooling plate 132. The shielding ring 134 is formed from a dielectric material, for example, quartz, and is formed in a substantial ring shape as shown in FIG. 3(b) and FIG. 4.

Further, a surface treatment for suppressing the generation of particles is carried out on the shielding ring 134. When the surface treatment is carried out, first, sand blasting processing is carried out on the surface of the shielding ring 134 formed in a substantial ring shape by machining, for example, is carried out on the surface exposed to the interior of the processing chamber 102, and a so-called crushed layer such as tool marks, burrs, or the like is removed, and the surface is flattened. Moreover, the blasting processing is carried out more excessively than normal blasting processing in which the processing is carried out until the crushing layer is removed, for example, is carried out for a time of about two times of the time over which the normal blasting processing is carried out. Next, the shielding ring 134 after the over-blasting processing is immersed in an HF (hydrofluoric acid) solution whose concentration is about 15% for 10 to 60 minutes, or preferably for 30 to 60 minutes, and HF (hydrofluoric acid) processing is carried out.

Figures 5, 6:
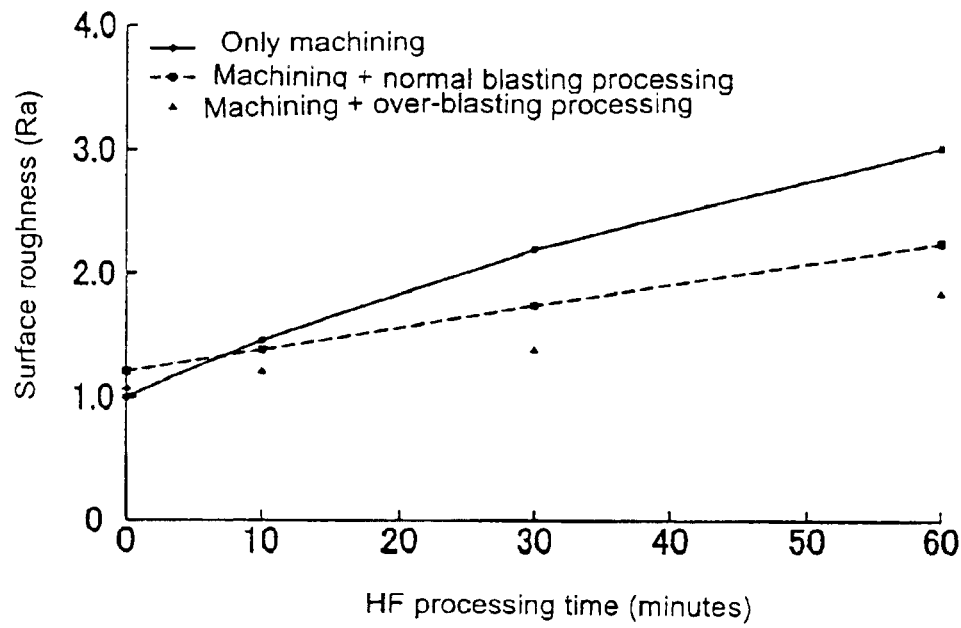
FIG. 5 is a schematic explanatory diagram for explaining surface treatments of the shielding ring of the etching device shown in FIG. 1.
FIG. 6 is a schematic explanatory diagram for explaining surface treatments of the shielding ring of the etching device shown in FIG. 1.
Figure 7:
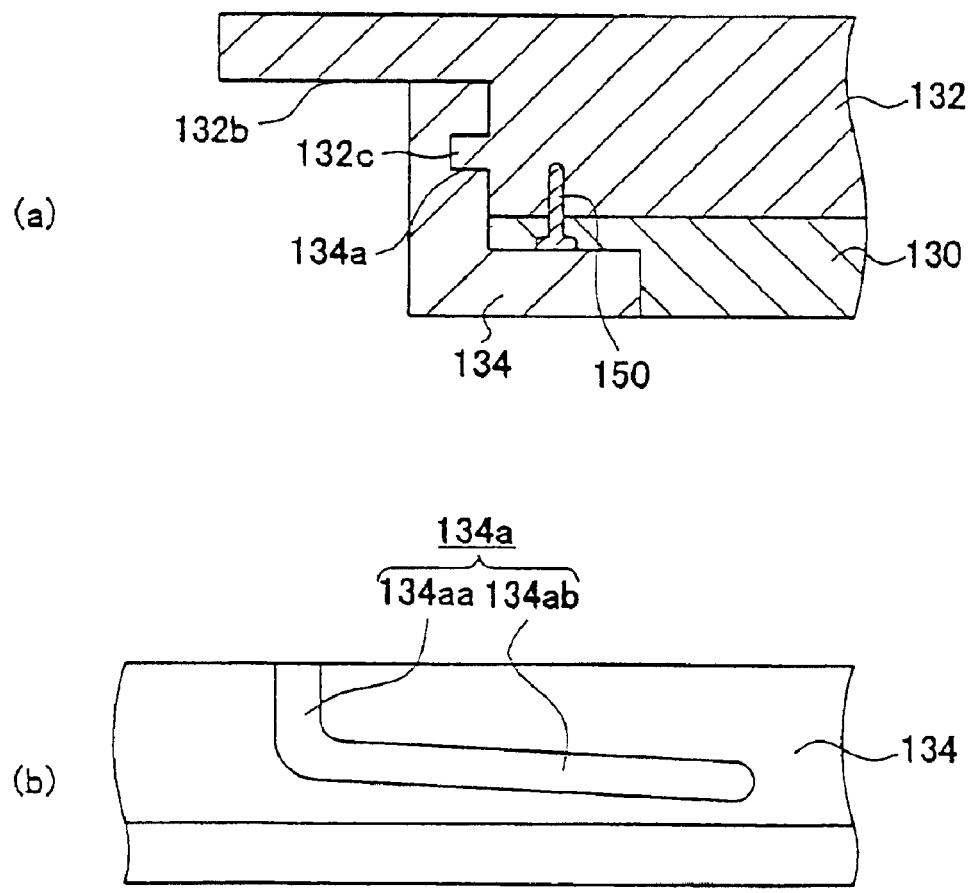
FIG. 7($a$) is a schematic enlarged cross-sectional view expressing a mounting portion of the shielding ring of the etching device shown in FIG. 1.

In accordance with such a processing, as shown in FIG. 5, the surface roughness of the shielding ring 134 can be lower than a case in which only the machining or the machining and the normal blasting processing are carried out. As a result, as shown in FIG. 6, the number of particles generated from the shielding ring 134 can be decreased more than the case in which only the machining or the machining and the normal blasting processing are carried out. Note that, as shown in FIG. 5, the surface roughness of the shielding ring 134 increases in accordance with processing time of the HF processing. However, if the processing time is between 10 to 60 minutes, as shown in FIG. 6, the number of particles can be decreased.

Further, by covering the surface (a portion exposed to plasma) of the shielding ring 134 with an SiC film by a CVD manufacturing method, the plasma resistance can be improved. The SiC film is preferably about 2 to 3 mm, and if the amount of wear of the SiC film is predicted from processing time and the SiC film is re-coated before the quartz which is the base material is exposed, the SiC film can be repeatedly used without wearing the base material.

Further, as shown in FIG. 2 through FIG. 4 and FIG. 7, a plurality of grooves 134a, which relate to the present embodiment and which are for fitting together the shielding ring 134, are formed at the side surface (inner peripheral surface) of the cooling plate 132 of the shielding ring 134. The grooves 134a are formed so as to correspond to a plurality of projections 132c formed at the outer peripheral surface of the cooling plate 132. Further, as shown in FIG. 7(b), the grooves 134a are formed from a first groove 134aa and a second groove 134ab. The first groove 134aa is formed so as to extend in a fitting-together direction of the shielding ring 134, for example, in a direction perpendicular to the processing chamber 102 side surface of the shielding ring 134. Further, the second groove 134ab is formed so as to incline in the fitting-together direction, for example, in a direction of the processing chamber 102 side surface of the shielding ring 134, as the second groove 134ab proceeds deeper in the circumferential direction. Note that, before and after the blasting processing, even if a processing such as fire-polishing, sand-rubbing, or the like is added, the same effects can be obtained.

In accordance with such a structure, at the time of mounting, first, the shielding ring 134 is fitted together with the cooling plate 132 such that the projections 132c and the first grooves 134aa correspond. Thereafter, if the shielding ring 134 is rotated in a direction opposite to the extending direction of the second grooves 134ab, the shielding ring 134 can be mounted to the cooling plate 132. Further, in the case of removing, operations in the order inverse to the above-described order are carried out, and first, the shielding ring 132 is rotated in the extending direction of the second grooves 134ab. Thereafter, the shielding ring 134 is pulled from the cooling plate 132, and therefore, the shielding ring 132 can be removed. Therefore, mounting and removal of the shielding ring 134 can be carried out without using fastening members such as screws or the like. As a result, the mounting and removal of the shielding ring 134 can be easily carried out, and the burden on a maintenance worker can be reduced. Further, in accordance with such a structure, because the shielding ring 134 is not fixed by fastening members, the shielding ring 134 can be moved after mounting as well. Therefore, as in a case in which the shielding ring 134 is formed from quartz and the cooling plate 132 is formed from aluminum, even if both members whose coefficients of linear expansion are different are combined, the load on the shielding ring 134 or the cooling plate 132 due to the heat generated at the time of processing can be reduced. As a result, the range of selection of structural materials of the shielding ring 134 and the cooling plate 132 can be broadened.

Further, the integrated assembly formed from the above-described upper electrode 130, cooling plate 132, and shielding ring 134 is supported by the insulator 136 as shown in FIG. 2. The insulator 136 functions as an insulating member insulating the cooling plate 132 transmitting high-frequency electric power and the processing container 104, and is formed from, for example, a ceramic. Further, the insulator 136 is formed in a substantially tubular shape so as to surround the periphery of the cooling plate 132 and the shielding ring 134.

Further, the step portion 136a, which can be engaged with the overhang portion 132b formed at over the periphery of the cooling plate 132 described above, is formed at the top portion of the inner periphery of the insulator 136. In accordance with such a structure, the assembly formed from the upper electrode 130, the cooling plate 132, and the shielding ring 134 can be fixed at a predetermined position by simply inserting it into the insulator 136. Therefore, the assembly can be easily mounted and removed without using fastening members.

Further, a step portion 136b, which can be engaged with the top end portion of the processing container 104, is formed at the bottom portion of the outer periphery of the insulator 136. In accordance with such a structure, the insulator 136 can be disposed at a predetermined position by simply fitting it together with the processing container 104. Further, O-rings 152, 154 as sealing members are provided between the insulator 136 and the cooling plate 132, and between the insulator 136 and the processing container 104. Further, the insulator 136 is fixed to the shield box 138 structuring the upper assembly 126 by the lock mechanism 156 which will be described in detail hereinafter, so as to be freely mounted and removed.

(b) Structure of Upper Assembly

Next, to described the structure of the upper assembly 126, the shield box 138 is for preventing high-frequency electric power from leaking to the exterior of the device, and is formed from, for example, stainless steel. As shown in FIG. 2, the shield box 138 is formed in a substantially tubular shape so as to surround the feeding bar 142 and the electro-body 144, and the periphery of the lower assembly 128. Further, the shield box 138 is supported by the processing container 104. Further, the shield box 138 is grounded via the processing container 104 and an unillustrated earthing wire.

Figure 8:
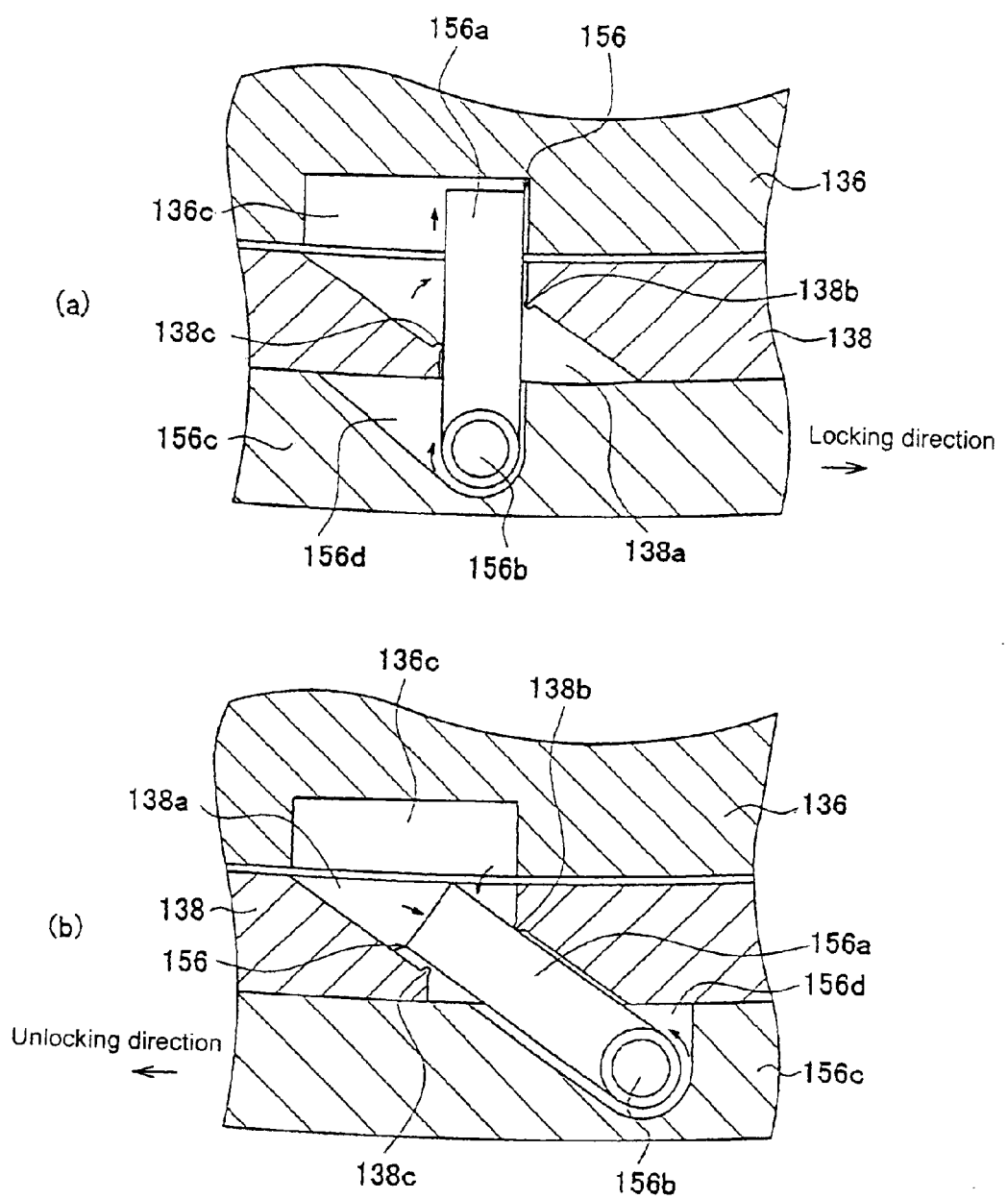
FIG. 8($a$) is a schematic cross-sectional view in which a lock mechanism at the time of locking shown in FIG. 2 is cut at a plane along line A—A.

Further, the shield box 138 is fixed, so as to be freely mountable and removable, to the insulator 136 structuring the lower assembly 128, by the lock mechanism 156 relating to the present embodiment. As shown in FIG. 8, the lock mechanism 156 is structured mainly from a fixing pin 156a fixing the insulator (corresponding groove side member) 136, and a supporting member (first member) 156c supporting the fixing pin 156a via a rotating shaft 156b. The fixing pin 156a is formed from, for example, stainless steel, and is formed in a substantial bar shape. The supporting member 156c is formed from, for example, aluminum, and is formed in a substantial ring shape so as to be able to rotationally-move with respect to the outer peripheral surface of the shield box (second member) 138. Further, a groove 156d, which allows the fixing pin 156a to move between a first position, at which the fixing pin 156a projects in a direction perpendicular to the insulator 136 as shown in FIG. 8(a), and a second position, at which the fixing pin 156a tilts and withdraws from the insulator 136 as shown in FIG. 8(b), is provided at the supporting member 156c.

Further, as shown in FIG. 8, a pass-through hole 138a, which enables the fixing pin 156a to be inserted through up to a fixing pin corresponding groove 136c provided at the outer peripheral surface of the insulator 136, is formed at the side wall of the shield box 138. The pass-through hole 138a is formed in a shape which enables the fixing pin 156a to move between the aforementioned first and second positions. Further, first and second projections 138b, 138c are provided at the inner wall surface of the pass-through hole 138a. The first projection 138b is a fulcrum when the fixing pin 156a moves from the aforementioned second position to the first position at the time of making the supporting member 156c move in the unlocking direction shown in FIG. 8(a). Further, the second projection 138c is a fulcrum when the fixing pin 156a moves from the aforementioned first position to the second position at the time of making the supporting member 156c move in the locking direction shown in FIG. 8(b).

In accordance with such a structure, by making the supporting member 156c move relatively with respect to the shield box 138, for example, making the supporting member 156c rotate in a locking direction, the fixing pin 156a projects into the fixing pin corresponding groove 136c at the first position, and the shield box 138 and the insulator 136 are fixed. Further, by making the supporting member 156c rotate in an unlocking direction with respect to the shield box 138, the fixing pin 156a withdraws to the second position, and the shield box 138 and the insulator 136 are separated. As a result, the upper assembly 126 including the shield box 138 and the lower assembly 128 including the insulator 136 can be easily and rapidly fixed so as to be freely mountable and removable without using fixing members such as screws, bolts, or the like. Further, the lock mechanism 156 has the function of positioning the upper assembly 126 and the lower assembly 128, and both of the respective assemblies can be fixed reliably.

Figure 9:
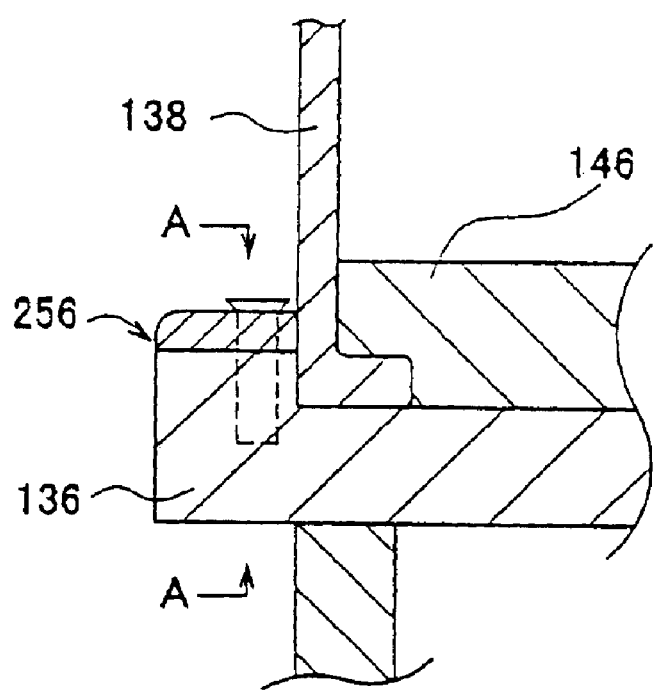
FIG. 9 is a schematic cross-sectional view showing another embodiment of the lock mechanism.
Figure 10:
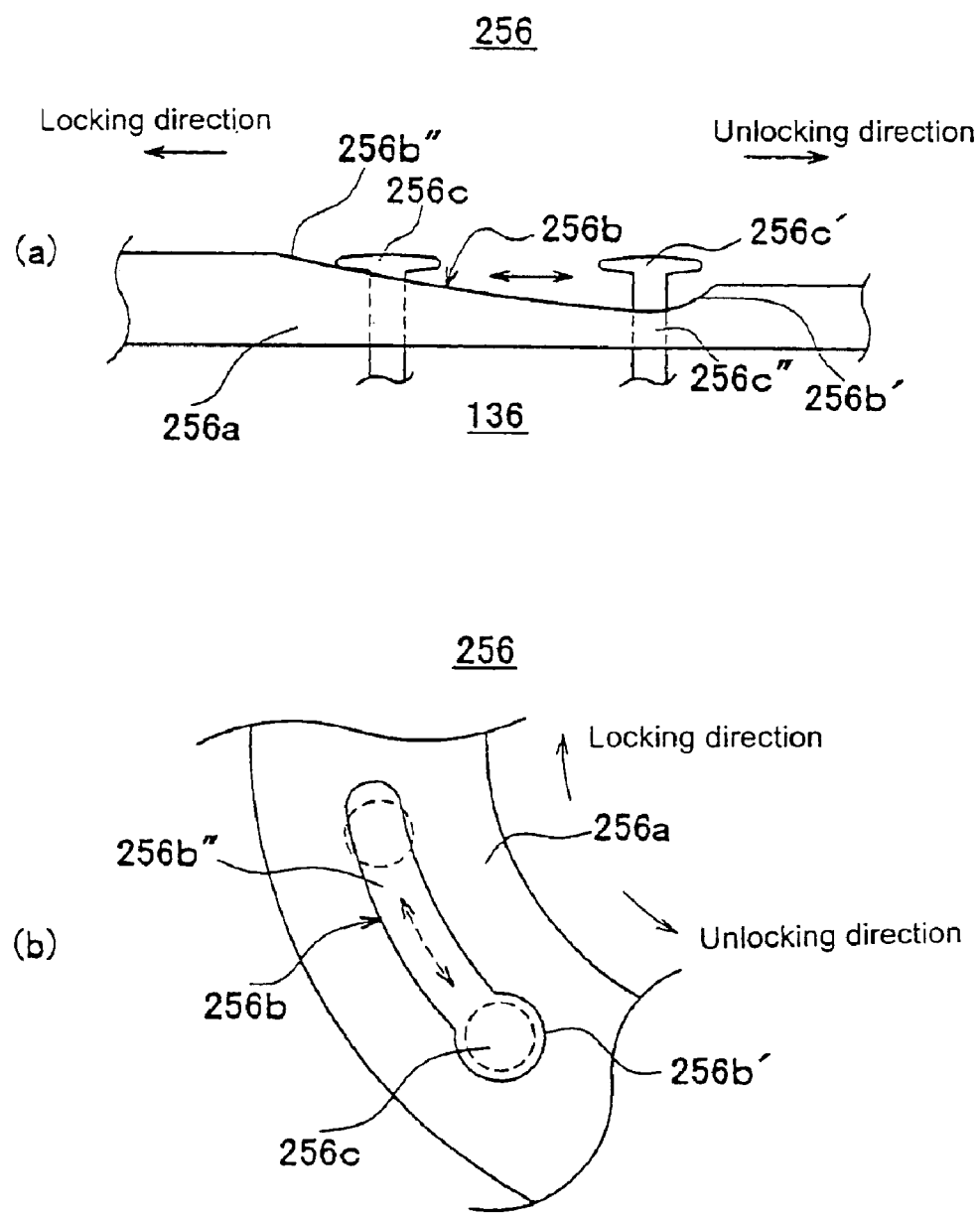
FIG. 10($a$) is a schematic cross-sectional view in which the lock mechanism shown in FIG. 9 is cut at the plane along line A—A, and FIG. 10($b$) is a schematic plan view of the lock mechanism shown in FIG. 9.

The lock mechanism locking the upper assembly 126 and the lower assembly 128 can be made to have a simpler structure. Next, the structure of a lock mechanism 256 having such a simple structure will be described with reference to FIG. 9 and FIG. 10.

The lock mechanism 256 is structured from a male member 256c provided at the insulator 136 forming a part of the lower assembly 128, and a female member 256a provided at the shield box 138 forming a part of the upper assembly 126. As shown in the figures, the male member 256c can be structured as a pin member fixed to the insulator 136. The pin member is structured from a shaft portion 256" and a head portion 256' having a diameter larger than that of the shaft portion 256".

A groove 256b for insertion and moving of the male member 256c is formed at the female member 256a. The groove 256b is structured from a insertion hole 256b' having a groove width in which the head portion 256c' of the male member 256c can be inserted, and a lock groove 256b" which communicates with the lock groove 256b" and which has a groove width which is smaller than the head portion 256c' of the male member 256c and larger than the shaft portion 256c". The lock groove 256" is disposed so as to be substantially along the radius of rotation of the shield box 138, and is structured so as to be able to guide the inserted male member 256c in accordance with the rotational motion. Further, the female member 256a is formed so as to be thin at the vicinity of the insertion hole 256b', and is formed so as to become successively thicker as it proceeds further away from the lock groove 256". In accordance with such a structure, a lock mechanism is realized in which, when the male member 256c is inserted from the insertion hole 254b', the head portion 256c' thereof is made to project from the insertion hole 254b', and the head portion 256c' and the surface of the lock groove 256" approach one another as the male member 256c is guided along the lock groove 256", and at the point in time when the reverse surface of the head portion 256c' finally abuts the surface of the lock groove 256", locking is completed.

Next, to simply explain operation of the above-described lock mechanism 256, first, when it is desired to lock the upper assembly 126 at the lower assembly 128, the male member 256c formed at the lower assembly 128 is inserted into the insertion hole 256b' of the female member 256a of the upper assembly 126. Next, the upper assembly 126 is rotated while guiding the male member 256c to the lock groove 256", and when the reverse surface of the head portion 256c' finally abuts the surface of the lock groove 256", locking is completed. When it is desired to unlock the upper assembly 126 from the lower assembly 128, it suffices that operations in the inverse order are carried out. As described above, in accordance with the lock mechanism 256, the lock mechanism is realized with a simpler structure. Note that, with regard to the arrangement of the male member and the female member, the same effects can be obtained even if they are structured such that the top and bottom thereof are reversed.

Further, as shown in FIG. 2, the matching box 140 which is manufactured from, for example, stainless steel, and which accommodates a matching machine 112 is mounted on the shield box 138. A substantially convex-shaped outputting section 112a, which projects into the shield box 138, of the matching machine 112 is fixed to the bottom portion of the matching box 140 via an unillustrated insulating member. The feeding bar 142 for transmitting high-frequency electric power to the electro-body 144 is connected to the outputting section 112a.

The feeding bar 142 is formed from a substantially tubular member manufactured from, for example, stainless steel, and is connected to the aforementioned outputting section 112a and an inputting section 144a formed at the electro-body 144 via an unillustrated, conductive, polyhedral contact having elasticity. Further, the outputting section 112a of the matching machine 112 and the top end portion of the feeding bar 142 are fixed by an unillustrated screw. On the other hand, the bottom end portion of the feeding bar 142 and the inputting section 144a of the electro-body 144 are fixed by an unillustrated pin or the like so as to be freely movable up and down by about several mm. In accordance with such a structure, if the upper assembly 126 is set on the lower assembly 128, the electro-body 144 tightly contacts the cooling plate 132 due to the weight of the electro-body 144, and the airtightness of the processing chamber 102 is ensured.

Further, in such a case, the cooling plate 132 tightly contacts the insulator 136 due to the weight of the electro-body 144. Further, the insulator 136 tightly contacts the processing container 104 by the weights of the electro-body 144 and the lower assembly 128. As a result, because the aforementioned respective members tightly contact one another, the interior of the processing chamber 102 can be maintained airtight. Further, if the interior of the processing chamber 102 is evacuated, the cooling plate 132 and the insulator 136, and the insulator 136 and the processing container 104 contact one another even more tightly. Therefore, the airtightness of the processing chamber 102 can be further improved.

Further, as described above, the electro-body 144 is for transmitting high-frequency electric power to the cooling plate 132, and is structured from a substantially disc-shaped member formed from, for example, anodized aluminum. Further, a space 144b which, can accommodate the baffle plate 148 for diffusing the processing gas, is formed at the bottom portion of the electro-body 144. Further, a gas supplying path 144c, for supplying processing gas from an unillustrated gas supply source to the space 144b, is incorporated within the electro-body 144. Further, the baffle plate 148 disposed in the space 144b is structured from substantially disc-shaped upper and lower baffle plates 148a, 148b formed from, for example, anodized aluminum. The upper and lower baffle plates 148a, 148b are fixed to the electro-body 144 by fastening members 158. Further, pass-through holes 148aa, 148ba are respectively formed in the upper and lower baffle plates 148a, 148b. In accordance with such a structure, the processing gas is transmitted to gas discharging holes 130a via the gas supplying path 144c, the baffle plate 148, and the gas supplying paths 132a.

A refrigerant circulating path 144d, circulating a refrigerant for absorbing the heat generated at the upper electrode 130 at the time of processing and for maintaining the upper electrode 130 at a predetermined temperature, is incorporated in the electro-body 144. Further, an O ring 160 as a sealing member and a conductive O ring 162 for ensuring conductivity are set between the electro-body 144 and the cooling plate 132.

Further, the electro-body 144 is supported by the insulator 146 for insulating the electro-body 144 and the shield box 138. The insulator 146 is formed from an insulating material, for example, a ceramic, and is formed in a substantially tubular shape so as to be able to surround the periphery of the electro-body 144. Further, a step portion 146a, which can be engaged with an overhang portion 144e formed at the top portion of the outer periphery of the electro-body 144, is formed at the top portion of the inner periphery of the insulator 146. In accordance with such a structure, the electro-body 144 is supported by the insulator 146 by being inserted into the insulator 146. Further, a step portion 146b, which can be engaged with an overhang portion 138d formed at the bottom portion of the inner wall of the shield box 138, is formed at the bottom portion of the outer periphery of the insulator 146. In accordance with such a structure, the insulator 146 is, along with the electro-body 144, supported by the shield box 138.

Further, a lift mechanism 164, for making the upper assembly 126 alone or the upper and lower assemblies 126, 128 integrally move from the mounted positions and separating it or them from the etching device 100, is connected to the periphery of the outer periphery of the shield box 138. Note that the mounting and removing structure of the upper and lower assemblies 126, 128 will be described later.

(3) Mounting and Removing Structure of Upper and Lower Assemblies

Next, the mounting and removing structure of the upper and lower assemblies 126, 128 will be described by using, as an example, a case in which maintenance of the lower assembly 128 and maintenance of the interior of the processing chamber 102 are carried out.

(a) Maintenance of Lower Assembly

Figure 11:
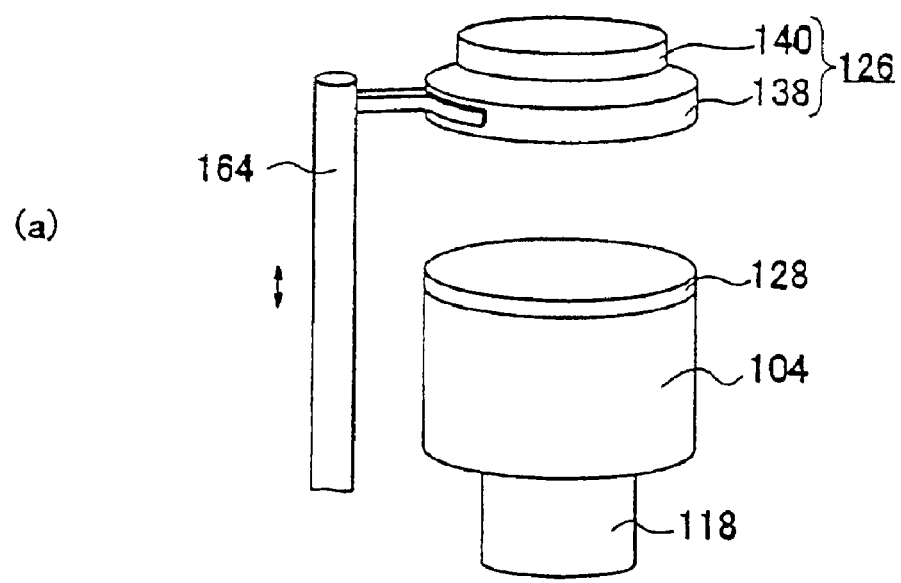
FIG. 11($a$) is a schematic perspective view expressing a state at the time of maintenance of a lower assembly of the etching device shown in FIG. 1.
Figure 11:
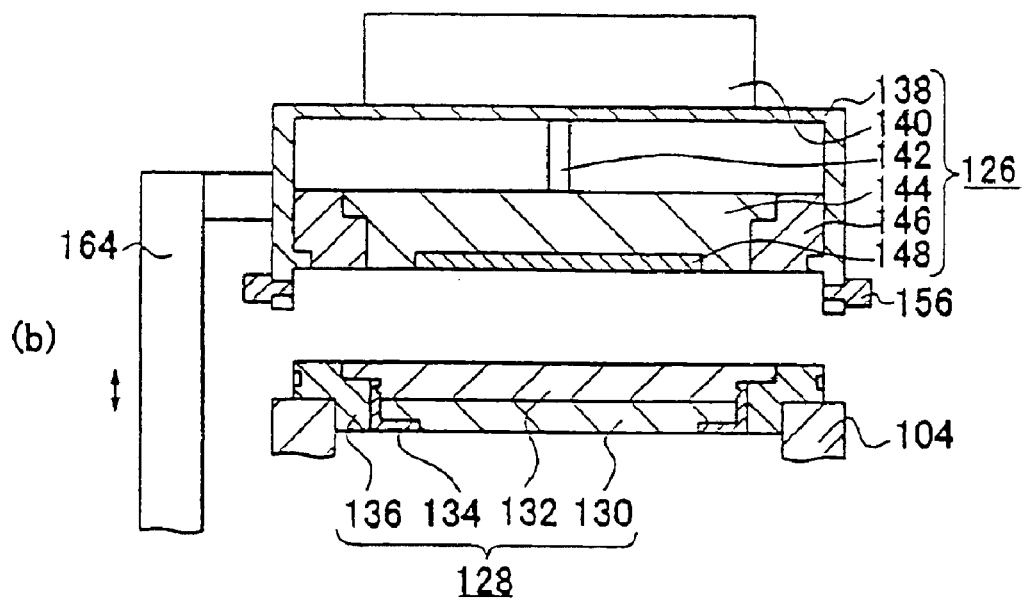

When the lower assembly 128 is to be subjected to maintenance, first, as shown in FIG. 11, the lock mechanism 156 fixing the insulator 136 and the shield box 138 is released. Thereafter, the upper assembly 126 is raised by the lift mechanism 164, and is made to withdraw from the mounting position. In accordance with such a process, the lower assembly 128 is exposed. As already described, because the upper assembly 126 and the lower assembly 128 are not fixed by screws or the like, the above-described operation is possible.

Next, as shown in FIG. 3(a), the assembly, which is formed from the upper electrode 130, the cooling plate 132, and the shielding ring 134 which are integrated and fit together with the insulator 136, is removed by the hands of maintenance worker. In accordance with such a process, only the insulator 136 remains on the processing chamber 102. As shown in FIG. 3(b) and FIG. 4, the removed assembly is removed in order of the shielding ring 134 and the upper electrode 130, and they are separated from the cooling plate 132. Thereafter, the upper electrode 130 and the shielding ring 134, to which reaction products generated at the time of processing adhere or which are worn by impact of the plasma, are cleaned or exchanged. Note that, after completion of the maintenance, the upper electrode 130, the cooling plate 132, and the shielding ring 134 are returned to the original state by carrying out processes in the inverse order to that described above. As described above, because the cooling plate 132 and the shielding ring 134 are not fixed by screws or the like, the maintenance can be rapidly and simply carried out. Further, the insulator 136 set on the processing chamber 102 as well may be subjected to maintenance by a worker removing it. Further, the upper assembly 126 as well may be subjected to maintenance.

Thereafter, the assembly formed from the upper electrode 130, the cooling plate 132, and the shielding ring 134 which have been subjected to maintenance, is fit together with and mounted to the insulator 136 again. At this time, if the removed assembly formed from the upper electrode 130, the cooling plate 132, and the shielding ring 134 is not mounted again and a spare assembly which has been subjected to maintenance is mounted, the maintenance time can be shortened. Further, the lift mechanism 164 is lowered, and the upper assembly 126 is mounted to the lower assembly 128, and the shield box 138 and insulator 136 are fixed by the lock mechanism 156. The maintenance operation of the lower assembly 128 is thereby completed.

(b) Maintenance of Interior of Processing Chamber

Figure 12:
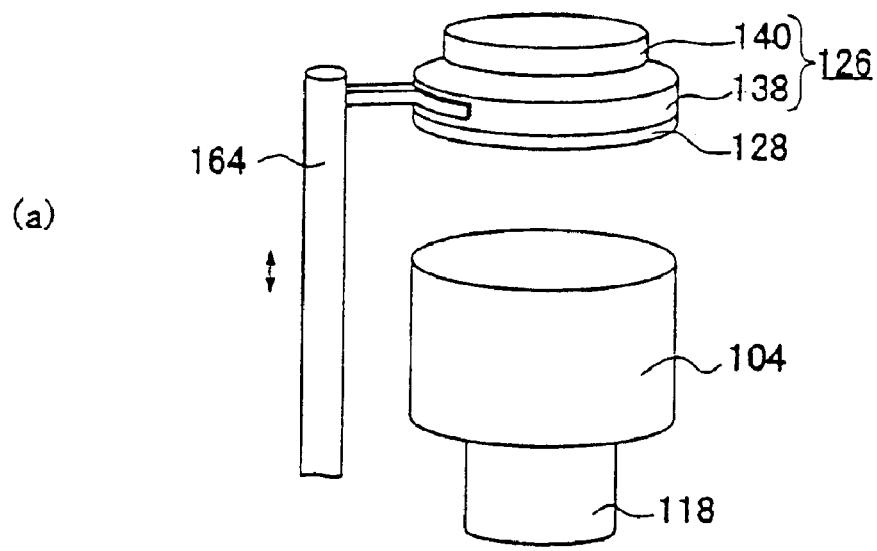
FIG. 12($a$) is a schematic perspective view showing a state at the time of maintenance of an interior of a processing chamber of the etching device shown in FIG. 1.
Figure 12:
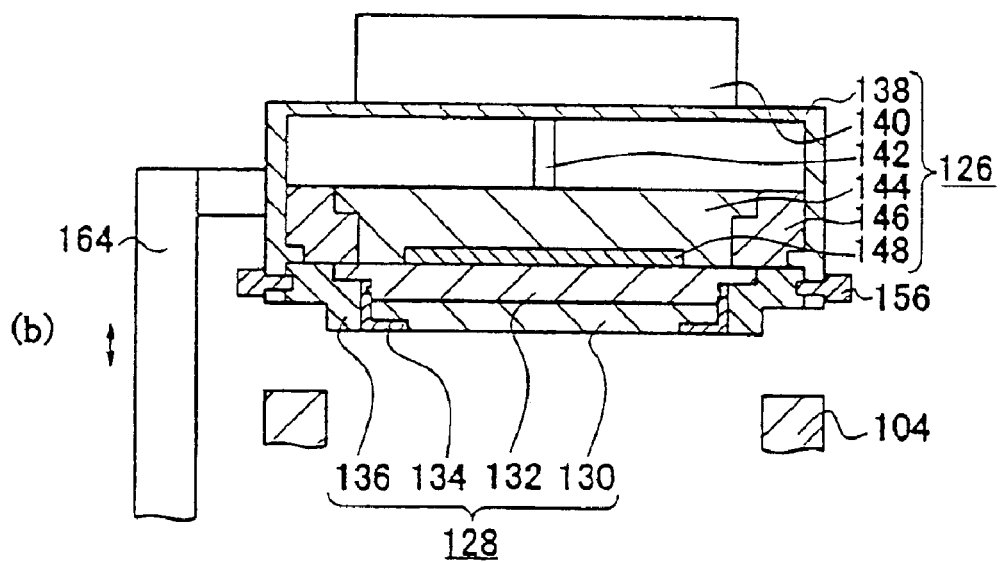

When the interior of the processing chamber 102 is to be subjected to maintenance, first, as shown in FIG. 12, the lock mechanism 156 fixing the insulator 136 and the shield box 138 is locked. Next, the upper and lower assemblies 126, 128 are integrally raised by the lift mechanism 164, and are withdrawn from the mounting positions. In accordance with such a process, the interior of the processing chamber 102 is completely freed. Thereafter, maintenance of the interior of the processing chamber 102, for example, cleaning for removing the deposit adhering to the inner wall of the processing container 104, is carried out. Further, in the opposite order of the above description, the lift mechanism 164 is lowered and the upper and lower assemblies 126, 128 are integrally mounted on the processing container 104. The maintenance operation is thereby completed.

As described above, a preferred embodiment of the present invention was described with reference to the attached figures. However, the present invention is not limited to such a structure. Various modified examples and improved examples can be conceived of by a person skilled in the art within the category of the technical concepts recited in the claims, and it can be understood that these modified examples and improved examples fall within the technical scope of the present invention.

For example, in the above-described embodiment, description was given by stipulating the specific members to be the upper and lower assemblies. However, the present invention is not limited to such a stipulation. The present invention can be implemented also in a case, in which members included in the respective assemblies are different than those of the above-described embodiment.

Further, in the above-described embodiment, an example of a structure in which the projections are formed at the cooling plate and the grooves are formed in the shielding ring was described. However, the present invention is not limited to such a structure. The present invention can be implemented by forming the projections or the grooves at either of the cooling plate or the shielding ring.

Further, in the above-described embodiment, an example of a structure in which the lift mechanism is always connected to the shield box was described. However, the present invention is not limited to such a structure. The present invention can be implemented by fixing the lift mechanism to the upper assembly only at a time maintenance.

Further, in the above-described embodiment, an example of a structure in which the upper assembly or the lower assembly is raised and down by the lift mechanism was described. However, the present invention is not limited to such a structure. The present invention can be applied not only by raising and lowering the upper assembly or the lower assembly, but also by rotating them as well.

Figure 13:
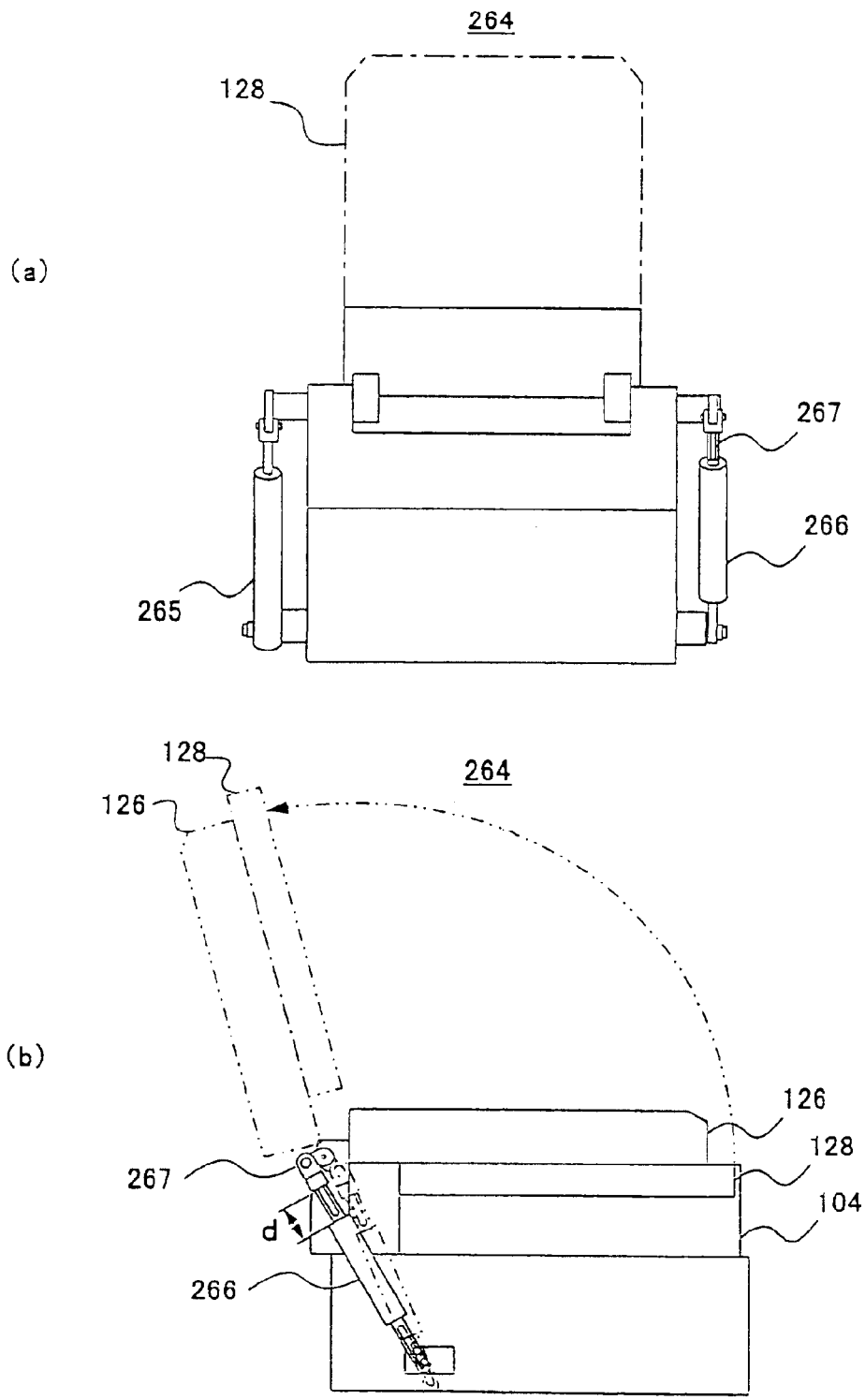
FIG. 13($a$) is a schematic front view expressing a modified example of a lift mechanism.

A modified example of the lift mechanism is shown in FIG. 13. FIG. 13(a) is a front view of a lift mechanism 264, and FIG. 13(b) is a side view of the lift mechanism 264. In FIGS. 13(a), 13(b), the two-dot chain lines show states in which the upper and lower assemblies 126, 128 are open with respect to the processing container 104, and the solid lines show states in which the upper and lower assemblies 126, 128 are closed with respect to the processing container 104.

The lift mechanism 264 is structured from a main cylinder 265 integrally or independently supporting the loads of the upper and lower assemblies 126, 128, and a sub-cylinder 266 which is turned on when the loads of the upper and lower assemblies 126, 128 are integrally supported and raised, and which is turned off when the upper assembly 126 is singly supported and raised. Namely, the sub-cylinder 266 has an on/off selective type adjust stopper 267, and is structured so as to work interlockingly with the above-described lock mechanism 156, and the sub-cylinder 266 is turned off (held in an extended state) interlockingly with the operation of releasing the lock mechanism 156. In FIG. 13(b), reference numeral d shows the range of movement of the adjust stopper 267. In accordance with such a structure, also when only the upper assembly 126 is operated to open or close, springing up of the upper assembly 126 is prevented, and the upper assembly 126 can be safely operated to open or close.

Further, in the above-described embodiment, an example of a structure in which maintenances of the lower assembly and the interior of the processing chamber are carried out was described. However, the present invention is not limited to such a structure. The present invention can also be applied to a case in which maintenance of the upper assembly is carried out.

Further, in the above-described embodiment, an example of a structure in which high-frequency electric power is applied to the upper electrode was described. However, the present invention is not limited to such a structure. The present invention can be implemented even if the upper electrode is an earthed electrode. At this time, an electro-body, a feeding bar, and a cooling plate may be used as earthed paths.

Further, in the above-described embodiment, an example of a plane parallel plate type etching device was described. However, the present invention is not limited to such a structure. The present invention can be applied to various types of plasma processing devices as well, such as a magnetron type plasma processing device, an inductive coupling plasma processing device, or the like. Further, the present invention can also be applied to not only etching processing but a device, carrying out various types of plasma processing processes such as an ashing processing, a film-forming processing, or the like. Further, the present invention can also be applied to a device carrying out processing on a glass substrate for an LCD.

In accordance with the present invention, the upper electrode unit whose weight is heavy is divided into the two upper and lower assemblies which are easy for a worker to work on, and is moved by a lift mechanism. Therefore, the burden on the worker can be reduced. Further, because areas were the upper and lower assemblies are fastened together and the structural members of the respective assemblies are fastened together without using a fastening means or by a fastening means are decreased, the working time can be shortened.

Industrial Applicability

The present invention can be applied to a processing device used in the process of manufacturing a semiconductor device, and in particular, can be applied to a processing device having an upper electrode unit forming the ceiling portion of a processing chamber, and a lift mechanism which can raise and lower the upper electrode unit.

What is claimed is:

1. A processing device having an upper electrode unit structuring a ceiling portion of a processing chamber, and a lift mechanism which can raise and lower the upper electrode unit, wherein the upper electrode unit is structured from an upper assembly and a lower assembly;

the upper assembly and the lower assembly can be separated and united by a lock mechanism provided at an outer peripheral surface of the upper electrode unit;

the upper assembly and the lower assembly can be integrally raised by the lift mechanism in a state in which the lock mechanism is locked; and only the upper assembly can be raised by the lift mechanism in a state in which the lock mechanism is unlocked.

2. A processing device according to claim 1, wherein the lower assembly is supported at a top end portion of a processing container via a sealing member, and can be airtightly fixed to the ceiling portion of the processing chamber by a difference in air pressure between an interior and the exterior of the processing container and weight of the upper electrode assembly.

3. A method of maintaining a processing device having an upper electrode unit structuring a ceiling portion of a processing chamber, and a lift mechanism which can raise and lower the upper electrode unit, and the upper electrode unit is structured from a lower assembly at a processing chamber side and an upper assembly at a power supply side, and the lower assembly and the upper assembly can be separated and united by only a lock mechanism provided at an outer peripheral surface of the upper electrode unit, and the lower assembly can be airtightly fixed to the ceiling portion of the processing chamber by differential pressure between an interior and an exterior of the processing chamber and weight of the upper electrode unit without a mechanical mechanism, said method comprising the step of:

maintaining the interior of the processing chamber after the upper assembly and the lower assembly are integrally raised by the lift mechanism in a state in which the lock mechanism is locked.

4. A method of maintaining a processing device having an upper electrode unit structuring a ceiling portion of a processing chamber, and a lift mechanism which can raise and lower the upper electrode unit, and the upper electrode unit is structured from a lower assembly at a processing chamber side and an upper assembly at a power supply side, and the lower assembly and the upper assembly can be separated and united by only a lock mechanism provided at an outer peripheral surface of the upper electrode unit, and the lower assembly can be airtightly fixed to the ceiling portion of the processing chamber by differential pressure between an interior and an exterior of the processing chamber and weight of the upper electrode unit without a mechanical mechanism, said method comprising the step of:

maintaining the upper assembly and/or the lower assembly after the upper assembly is raised by the lift mechanism in a state in which the lock mechanism is unlocked.

\* \* \* \* \*